(12) United States Patent
Geng et al.

(10) Patent No.: US 7,208,348 B2
(45) Date of Patent: Apr. 24, 2007

(54) METHODS OF FABRICATING A VIA-IN-PAD WITH OFF-CENTER GEOMETRY

(75) Inventors: Phil Geng, Portland, OR (US); Stephen C. Joy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 198 days.

(21) Appl. No.: 10/994,995

(22) Filed: Nov. 22, 2004

(65) Prior Publication Data

US 2005/0090040 A1  Apr. 28, 2005

Related U.S. Application Data

(62) Division of application No. 09/751,614, filed on Dec. 29, 2000, now Pat. No. 6,833,615.

(51) Int. Cl.
*H01L 21/48* (2006.01)
*H01L 23/48* (2006.01)
*H05K 7/10* (2006.01)

(52) U.S. Cl. ............ 438/125; 438/612; 257/774; 257/786; 361/767; 361/777

(58) Field of Classification Search ............ None
See application file for complete search history.

(56) References Cited

U.S. PATENT DOCUMENTS

| 4,024,629 | A | 5/1977 | Lemonie et al. ............ 29/625 |
| 5,315,485 | A | 5/1994 | Magill et al. ............ 361/767 |
| 5,425,816 | A | 6/1995 | Cavicchi et al. ............ 136/256 |
| 5,464,682 | A | 11/1995 | Perfecto et al. ............ 428/210 |
| 5,489,750 | A | 2/1996 | Sakemi et al. ............ 174/261 |
| 5,535,101 | A | 7/1996 | Miles et al. ............ 367/808 |
| 5,591,941 | A | 1/1997 | Acocella et al. ............ 174/266 |
| 5,706,178 | A | 1/1998 | Barrow ............ 361/777 |
| 5,784,262 | A | 7/1998 | Sherman ............ 361/777 |
| 5,796,589 | A | 8/1998 | Barrow ............ 361/774 |
| 5,815,374 | A | 9/1998 | Howell ............ 361/768 |
| 5,875,102 | A | 2/1999 | Barrow ............ 361/777 |

(Continued)

FOREIGN PATENT DOCUMENTS

JP    08-083975    3/1996

(Continued)

*Primary Examiner*—Alonzo Chambliss
(74) *Attorney, Agent, or Firm*—Schwegman, Lundberg, Woessner & Kluth, P.A.

(57) ABSTRACT

The electrical contacts, such as ball grid array (BGA) solder balls, of an integrated circuit (IC) are coupled to printed circuit board (PCB) bonding pads that include vias. According to an embodiment of an electronic assembly, the vias are formed off-center, so as to inhibit bridging between adjacent solder balls during a solder reflow operation by minimizing the effect of solder ball ballooning resulting from outgassing of a thermally expansive substance, such as a volatile organic compound (VOC) from the via channels. The bonding pads are separated into two groups, each having vias offset in a different direction, so that asymmetric surface tension forces in the molten solder during a solder reflow operation do not cause the IC to slide to one side. A substrate, an electronic assembly, an electronic system, and fabrication methods are also described.

13 Claims, 6 Drawing Sheets

U.S. PATENT DOCUMENTS

| | | | |
|---|---|---|---|
| 5,936,309 A | 8/1999 | Kim | 257/779 |
| 5,936,848 A | 8/1999 | Mehr et al. | 361/777 |
| 6,414,248 B1 | 7/2002 | Sundstrom | 174/260 |
| 6,429,389 B1 | 8/2002 | Chung et al. | 174/261 |
| 6,622,905 B2 | 9/2003 | Shier et al. | 228/180.22 |
| 6,833,615 B2 * | 12/2004 | Geng et al. | 257/698 |

FOREIGN PATENT DOCUMENTS

| | | |
|---|---|---|
| JP | 08-288658 | 11/1996 |
| JP | 2000-174410 | 6/2000 |
| JP | 2000-183531 | 6/2000 |
| WO | WO-00/22894 | 4/2000 |

* cited by examiner

METHODS OF FABRICATING A VIA-IN-PAD WITH OFF-CENTER GEOMETRY

DIVISIONAL APPLICATION

The present application is a divisional of application U.S. Ser. No. 09/751,614, filed on Dec. 29, 2000, now issued as U.S. Pat. No. 6,833,615, which is incorporated herein by reference.

RELATED APPLICATION

The present application is related to the following application which is assigned to the same assignee as the present application:

Ser. No. 09/712996, entitled "Via-in-Pad Apparatus and Methods", now U.S. Pat. No. 6,429,389.

TECHNICAL FIELD

The subject matter relates generally to electronics packaging. More particularly, the subject matter relates to apparatus and methods for coupling the electrical contacts of an integrated circuit to bonding pads having vias.

BACKGROUND INFORMATION

Integrated circuits (ICs) are typically assembled into packages that are physically and electrically coupled to a substrate such as a printed circuit board (PCB) to form an "electronic assembly". The "electronic assembly" can be part of an "electronic system". An "electronic system" is broadly defined herein as any product comprising an "electronic assembly". Examples of electronic systems include computers (e.g., desktop, laptop, hand-held, server, Web appliances, etc.), wireless communications devices (e.g., cellular phones, cordless phones, pagers, etc.), computer-related peripherals (e.g., printers, scanners, monitors, etc.), entertainment devices (e.g., televisions, radios, stereos, tape and compact disc players, video cassette recorders, etc.), and the like.

In the field of electronic systems there is an incessant competitive pressure among manufacturers to drive the performance of their equipment up while driving down production costs. This is particularly true regarding the packaging of ICs on substrates, where each new generation of board-level packaging must provide increased performance while generally being smaller or more compact in size.

A substrate typically includes a number of insulation and metal layers selectively patterned to provide metal interconnect lines (referred to herein as "traces"), and a plurality of electronic components mounted on one or more surfaces of the substrate and functionally interconnected through the traces. The routing traces typically carry signals that are transmitted among the electronic components, such as ICs, of the system. Some ICs have a relatively large number of input/output (I/O) pads. The large number of I/O pads requires a relatively large number of routing traces. Some PCBs require multiple layers of routing traces to accommodate all of the system interconnections.

Routing traces located within different layers are typically connected electrically by vias formed in the substrate. A via can be made by making a hole through some or all layers of a PCB and then coating or plating the interior hole surface with an electrically conductive material, such as copper or tungsten.

One of the conventional ways of mounting components on a substrate is called surface mount technology (SMT). SMT components have terminations or leads (generally referred to as "electrical contacts") that are soldered directly to the surface of the substrate. SMT components are widely used because of their compact size and simplicity of mounting. One conventional type of SMT component utilizes a ball grid array (BGA) to connect to the substrate. A BGA component has a plurality of solder balls on one surface, each of which represents an electrical contact. Each solder ball connects to a conductor within the component.

The electrical contacts of an SMT component, such as a BGA component, are coupled to corresponding metallized mounting or bonding pads (also referred to herein as "lands") on the surface of the substrate, in order to establish a secure physical connection to the substrate as well as to establish an electrical connection between the SMT component and at least one trace connected to the lands. Ordinarily one land is dedicated to one SMT electrical contact.

In order to fabricate PCBs in which components, including IC packages, are mounted in higher densities, it is known to use a via-in-pad structure. In this structure, a via is formed in each mounting pad or land, thus conserving valuable "real estate" on the PCB that would otherwise be separately occupied by the vias and the lands. The resulting electronic system can be manufactured at a lower cost and in a more compact size, and it is therefore more commercially attractive.

Before the SMT component is mounted on a substrate, the substrate lands are selectively coated with solder paste. To mount an SMT component to a substrate, the component is carefully positioned or "registered" over the substrate so that its electrical contacts (e.g. solder balls) are aligned with the corresponding lands. Finally, the solder balls and lands are heated to a temperature that melts the solder balls and the solder paste, so that they physically merge and form proper electrical and physical connections.

Before the substrate lands are coated with solder paste, a layer of solder mask or solder resist material is first applied to the substrate everywhere except the lands. For via-in-pad structures, via capping material is typically applied to the under surface of the substrate to plug the lower openings of the vias. Then, solder paste is applied to the lands on the substrate's upper surface.

The solder mask, the via cap, and the solder paste can comprise one or more volatile materials. Such materials can include volatile organic compounds (VOCs). One example of such a VOC is polyglycol, which is commonly used in PCB fabrication. Polyglycol has a boiling point of approximately 170 degrees Centigrade compared to the liquidus temperature of approximately 183 degrees Centigrade for solder paste.

For a PCB containing via-in-pads, problems can arise when the solder balls and lands are heated, because uncured or excessive VOC that resides in liquid form within the vias can expand or "outgas" upwards into the overlying solder balls. This can cause the solder balls to expand to the point where adjacent solder balls can be left touching, creating short circuits. This phenomenon is referred to as "BGA bridging". In addition, the forceful outgassing of VOCs can leave voids where the solder balls are supposed to make contact with the vias, creating significantly weakened connections or open circuits.

For the reasons stated above, and for other reasons stated below which will become apparent to those skilled in the art upon reading and understanding the present specification, there is a significant need in the art for apparatus and methods for coupling an integrated circuit to a substrate that offer relatively high density while providing a relatively high quality interconnection.

DETAILED DESCRIPTION

In the following detailed description, reference is made to the accompanying drawings which form a part hereof, and in which is shown by way of illustration specific preferred embodiments in which the subject matter may be practiced. These embodiments are described in sufficient detail to enable those skilled in the art to practice them, and it is to be understood that other embodiments may be utilized and that compositional, mechanical, and electrical changes may be made without departing from the spirit and scope of the present subject matter. The following detailed description is, therefore, not to be taken in a limiting sense, and the scope of embodiments of the present subject matter is defined only by the appended claims.

The present subject matter provides a solution to the problem of thermally expansive substances, such as volatile organic compounds (VOCs), outgassing during solder reflow to produce quality defects. Various embodiments are illustrated and described herein. In one embodiment, channels in via-in-pad structures are formed offset from the pad center to minimize the effect of outgassing during solder reflow. By offsetting the via channels within the pad or land, the ballooning of solder balls is significantly lessened, reducing the likelihood of adjacent solder balls touching, enabling more solder to remain in the solder joint, and reducing shear stress and shock fatigue on the land. Methods of fabrication, as well as application of the subject matter to a substrate, an electronic assembly, and an electronic system, are also described.

In addition to the foregoing advantages, the improved via-in-pad apparatus and methods of the present disclosure are compatible with existing packaging technologies, so that significant quality improvements are achieved at a relatively low implementation cost, thus making the apparatus and methods of the present disclosure commercially competitive.

Figure 1:
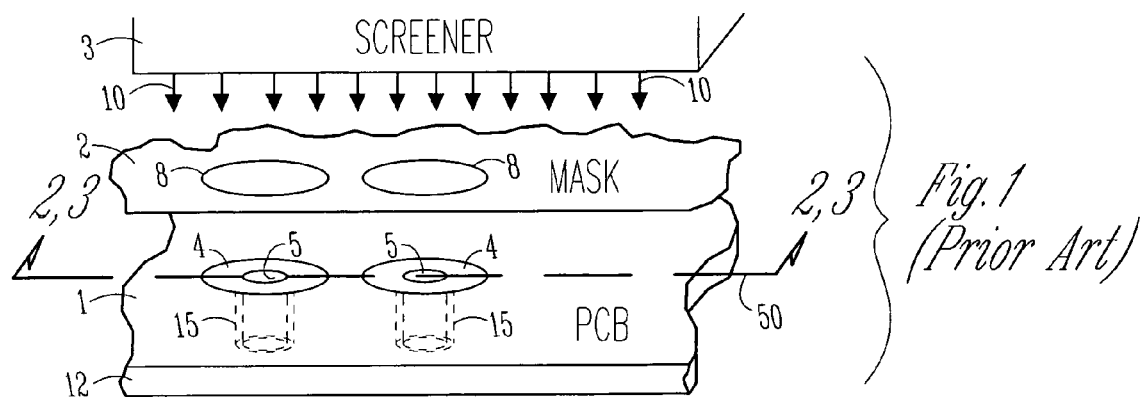
FIG. 1 is a perspective view of a prior art PCB, mask, and screener.

FIG. 1 is a perspective view of a prior art PCB 12, mask 2, and screener 3. A surface 1 of PCB 12 has a plurality of via-in-pad structures (only two of which are illustrated) each comprising an O-shaped land 4 formed above and coupled to a via 15 having a hole 5. Solder paste can be applied to each land 4, and a corresponding solder ball on an IC package can be coupled to land 4, as will be shown below.

Although in the IC packaging technology vias can be either solid or hollow, as used herein the term "via" means a hollow via. Via 15 comprises electrically conductive material, such as copper, that electrically connects circuit traces on different layers (not shown) of PCB 12. Via 15 can be of any type or cross-section but is typically circular. In the prior art structure illustrated in FIG. 1, via 15 is essentially a copper or copper-plated cylinder having a wall of finite, substantially uniform thickness that extends partially into PCB 12 (as indicated by the dashed lines) or entirely through PCB 12, depending upon how many layers of the PCB it is required to connect to. Vias 15 are typically formed by drilling a hole through all or a part of PCB 12 and then covering the interior wall of the hole with a conductive metal such as copper or tungsten.

As mentioned in the Background section above, the lands 4 on PCB 12 need to be coated with solder paste in preparation for joining with the corresponding solder balls of an IC package. To this end, a mask 2 is positioned over surface 1 of PCB 12, and a screener apparatus 3 dispenses solder paste through apertures 8 in mask 2 in the direction indicated by arrows 10. The solder paste normally comprises a combination of solder powder, flux, a suspension agent, and a solvent. The solder paste not only coats the lands 4, but it can also enter holes 5 into vias 15.

After the solder paste screening operation, the solder paste is allowed to cure or harden, during which time some or all of the liquid components evaporate, depending upon a number of process variables. When the volatile liquid component(s) do not all evaporate, significant problems can occur, as will be illustrated below regarding FIG. 3.

It should be noted that other masks can be used to apply other materials containing volatile liquid components to the surface 1 of PCB 12 before application of the solder paste as described above with reference to FIG. 1. For example, solder resist can be applied to define the areas of the surface 1 of PCB 12 where solder paste is to be retained. In addition, volatile liquid components, e.g., solvents, can be applied to PCB 12 without using masks.

Also, as mentioned earlier and described below, via caps (17, FIG. 2) positioned on the underside of vias 15, and typically extending upwards into the vias 15, can comprise uncured volatile components that outgas significantly when subjected to solder reflow temperatures. In some prior art via-in-pad structures, uncured volatile components in via capping materials constitute the most significant cause of outgassing during solder reflow.

The volatile liquid components within the various materials that can be applied to the surface 1 of PCB 12 are thermally expansive substances, i.e. they expand when subjected to heat. These volatile liquid components can be of any suitable type, and they often include volatile organic compounds, such as polyglycol.

Figure 2:
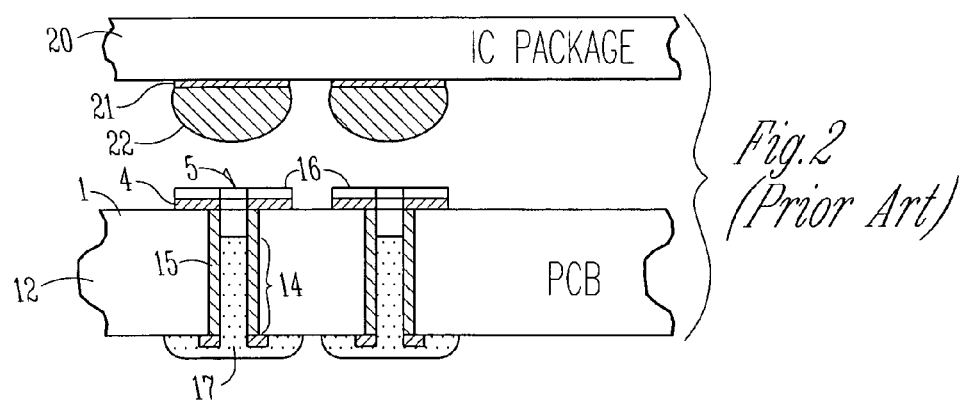
FIG. 2 is a cross-sectional view of the prior art PCB shown in FIG. 1 taken along line 50 of FIG. 1, and in addition a cross-sectional view of an IC package that is aligned for coupling to the prior art PCB.

FIG. 2 is a cross-sectional view of the prior art PCB 12 shown in FIG. 1 taken along line 50 of FIG. 1, and in addition a cross-sectional view of an IC package 20 that is aligned for coupling to the prior art PCB 12. Vias 15 are shown containing a thermally expansive substance, such as "via fill" 14, which in the prior art structure can include both cured material as well as thermally expansive material such as a volatile organic compound. The particular level of via fill 14 within vias 15 is merely illustrative; the level can range anywhere between full to empty.

In the prior art structure illustrated in FIG. 2, via fill 14 is primarily via capping material from via cap 17. However, via fill 14 can also include processing solvent residues. In addition, as mentioned earlier, via fill 14 can also include solder paste. As a result of an operation in which a solder paste material is applied to the upper surface 1 of PCB 12, solder paste 16 resides on lands 4 as well as within vias 15, where it constitutes a relatively minor part of via fill 14.

The lower side (as viewed in FIG. 2) of each via 15 has a via cap 17 to prevent via fill 14, such as solder paste, from running through the via. The via cap 17 can comprise epoxy, for example. Via cap materials typically require curing after their application to PCB 12. When these via cap materials are not fully cured, they can cause significant outgassing within via 15, thereby contributing to solder ball bridging, as will be discussed further below regarding FIG. 3. Via caps 17 not only cover the bottom openings of vias 15, but they also extend upward into vias 15.

IC package 20 comprises a plurality (only two of which are illustrated) of lands 21, to which are coupled contacts, bumps, or balls 22, each comprising an electrically conductive material such as solder. Solder balls 22 are of approximately the same shape, size, and pitch as lands 4. Solder balls 22 are aligned or "registered" with respect to lands 4.

In a subsequent reflow operation (to be described in FIG. 3 below), the package structure, comprising solder balls 22, lands 4, and vias 15, is heated substantially to the melting point or liquidus of the solder material. The purpose of the reflow operation is to cause solder balls 22 and the solder paste 16 on lands 4 to flow together, so that lands 21 of IC package 20 and lands 4 of substrate 12 become physically and electrically coupled upon cooling.

Figure 3:
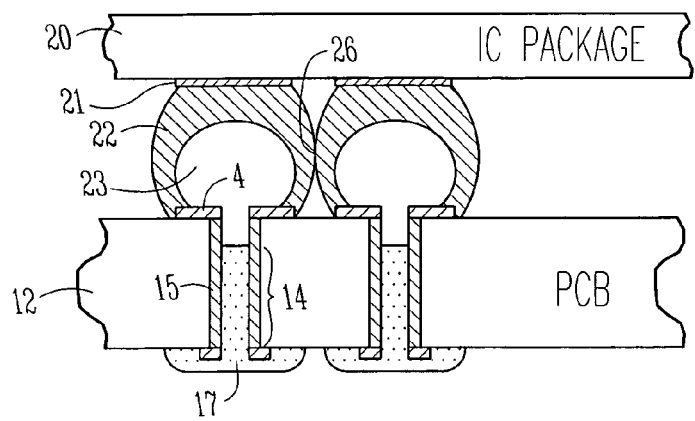
FIG. 3 shows the prior art PCB shown in FIG. 2 being coupled to an IC package during a solder reflow operation in which adjacent solder balls are bridged due to outgassing of volatiles.

FIG. 3 shows the prior art PCB 12 shown in FIG. 2 being coupled to an IC package 20 during a solder reflow operation in which adjacent solder balls 22 are bridged due to outgassing of volatiles.

When the package structure, comprising IC package 20 and PCB 12, is subjected to heat during a reflow operation, solder balls 22 become molten. In addition, any VOCs in via fill 14 within vias 15 heat up and expand. The VOCs in via fill 14 in the lower portion of via 15 are prevented from exiting downwardly from the via 15 by via cap 17. Due to the presence of unevaporated thermally expansive material within the via fill 14 when the prior art structure is heated to the solder liquidus, the via fill 14 can outgas in large bubbles 23 within the overlying molten solder balls 22, causing solder balls 22 to expand laterally in a ballooning effect. When adjacent solder balls 22 touch, as shown at area 26, shorts result within the electrical paths of the electronic structure, and the electronic structure can experience operational faults or even total failure.

The geometry of the via-in-pad structure illustrated in FIG. 3 contributes to bridging of adjacent solder balls 22. Solder balls 22 strongly adhere to lands 21 on IC package 20 as well as to lands 4 on PCB 12. Moreover, solder balls 22 have a high surface tension that causes solder balls 22, although molten, to retain a substantially spherical shape. Because vias 15 are centered within lands 4, the balloons formed by molten solder balls 22 are fairly symmetrical, and their walls have a substantially uniform thickness that is considerably resistant to collapse.

Figure 4:
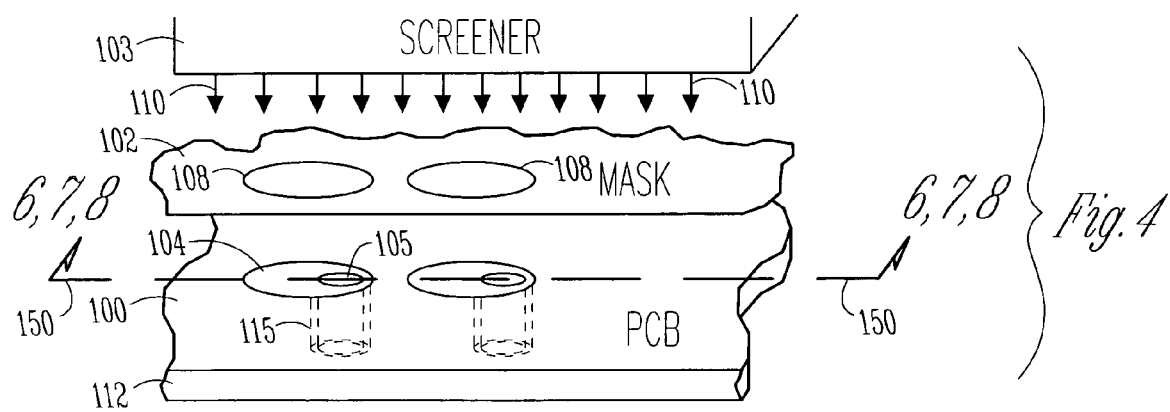
FIG. 4 is a perspective view of a PCB, mask, and screener, in accordance with one embodiment of the subject matter.

FIG. 4 is a perspective view of a PCB 112, mask 102, and screener 103, in accordance with one embodiment of the subject matter.

A surface 100 of PCB 112 has a plurality of via-in-pad structures (only two of which are illustrated) each comprising a land 104 formed above and coupled to a via 115 (shown in dashed lines) having a hole 105.

Vias 115 can be of any type or cross-section, but in the embodiment shown they are circular. Vias 115 can extend partially into PCB 112 or entirely through PCB 112, depending upon how many layers of the PCB they are required to connect to.

In one embodiment, vias 115 are drilled. Vias 115 have a finished diameter that is slightly less than their drilled diameter. In one embodiment, the unfinished diameter of vias 115 is in the range of 0.33 to 0.38 millimeters (13 to 15 mils). After plating, the finished diameter of vias 115 is in the range of 0.25 to 0.33 millimeters (10 to 13 mils). The diameter of lands 104 is in the range of 0.61 to 0.71 millimeters (24 to 28 mils).

In a manner similar to that described above regarding FIG. 1, lands 104 on PCB 112 are coated with solder paste in preparation for joining with the corresponding solder balls of an IC package. To this end, mask 102 is positioned over surface 100 of PCB 112, and screener apparatus 103 dispenses solder paste through apertures 108 in mask 102 in the direction indicated by arrows 110. The solder paste normally comprises a combination of solder powder, flux, a suspension agent, and a solvent. After this operation, the solder paste is allowed to cure or harden, during which time some or all of the liquid components evaporate, depending upon a number of process variables.

In a similar fashion as mentioned earlier regarding the prior art structure shown in FIG. 1, other materials containing VOC's or other volatile liquid components can be applied to the surface 100 of PCB 112, whether through the use of a mask or not, before application of the solder paste as described above with reference to FIG. 4. For example, solder resist can be applied to define the areas of the surface 100 of PCB 112 where solder paste is to be retained, such as lands 104. Also, via caps (117, FIG. 6) positioned on the underside of vias 115, and extending upwards into vias 115, can comprise uncured volatile components that outgas significantly when subjected to solder reflow temperatures.

The volatile liquid components within the various materials that can be applied to the surface 100 of PCB 112 are thermally expansive substances, i.e. they expand when subjected to heat. As for the prior art structure discussed earlier, these volatile liquid components can be of any suitable type, and they often include volatile organic compounds (VOC's), such as polyglycol.

Figure 5:
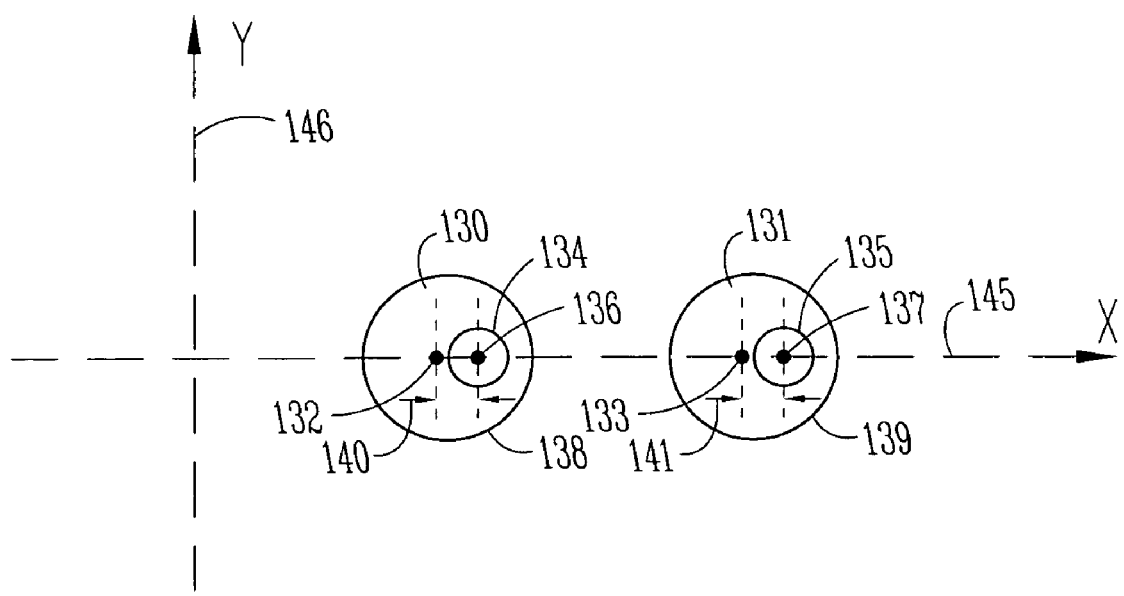
FIG. 5 is a diagrammatic top view of two lands, each having an off-center via, in accordance with one embodiment of the subject matter.
Figure 9:
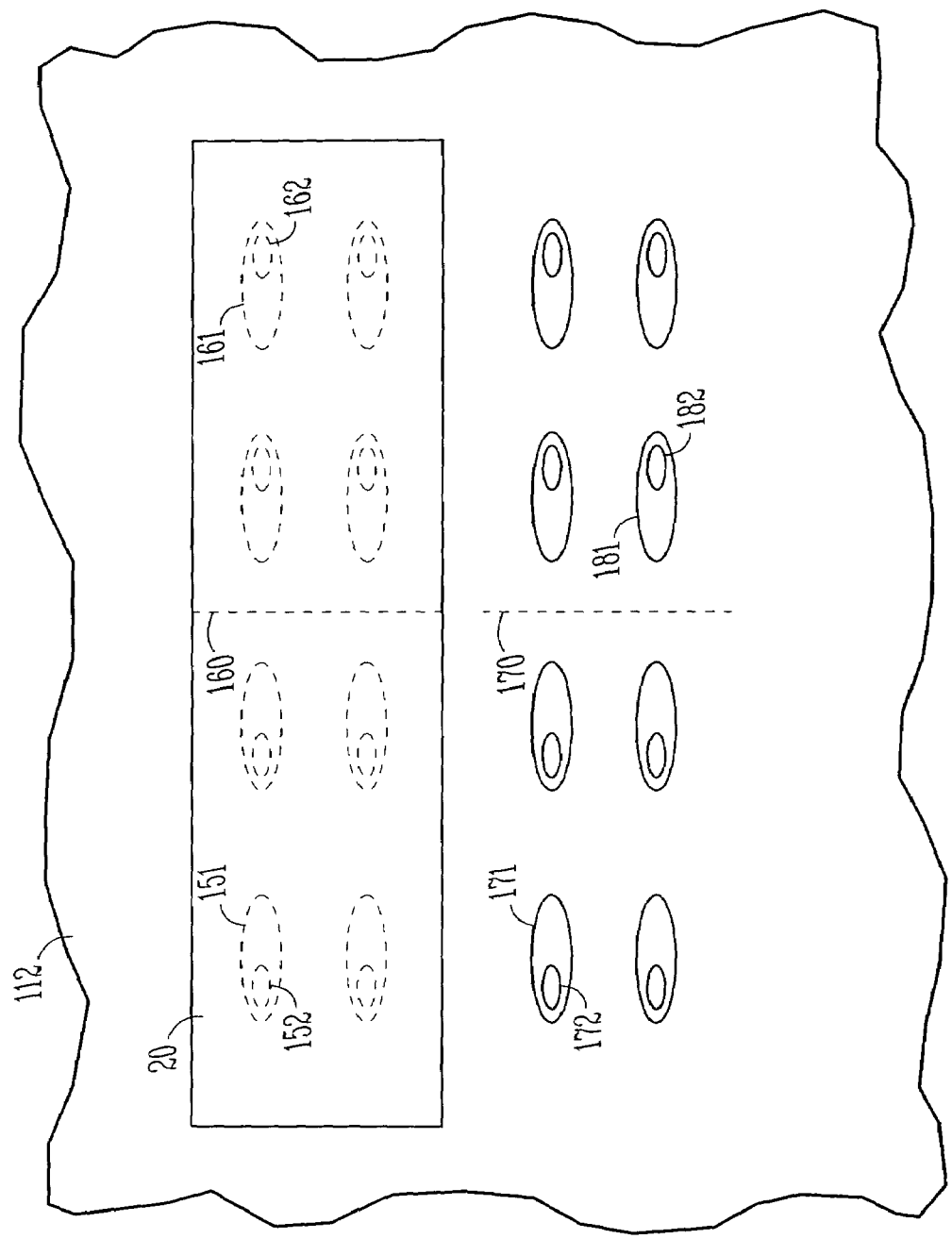
FIG. 9 is a top view of an IC overlying a portion of a substrate having a plurality of lands each having an off-center via, in accordance with one embodiment of the subject matter.

FIG. 5 is a diagrammatic top view of two lands 130 and 131, each having an off-center via 134 and 135, respectively, in accordance with one embodiment of the subject matter. Lands 130 and 131 represent any two adjacent lands from PCB 112, and they can be similar to or identical to lands 104 (FIG. 4). Although the lands on PCB 112 can be partitioned into at least two different groups, as illustrated in FIG. 9 and discussed below, lands 130 and 131 are assumed to be from the same group of lands. Land 130 comprises a via 134, and land 131 comprises a via 135.

Land 130 has a geometric center 132 and an edge 138 defining a substantially circular perimeter. Likewise, land 131 has a geometric center 133 and an edge 139 defining a substantially circular perimeter. Vias 134 and 135 have geometric centers 136 and 137, respectively.

Vias of adjacent lands 130 and 131 are formed at substantially the same offset distances 140 and 141, respectively, from the geometric centers of their respective lands. Also, the geometric centers of vias 135 and 136 of respective lands 130 and 131 are offset in substantially the same direction. In other words, the offsets 140 and 141 of vias 135 and 135, respectively, have substantially the same angle. For example, the geometric centers 136 and 137 of vias 130 and 131, respectively, are each offset from the geometric centers (132, 133) of their respective lands (130, 131) by ninety degrees (with reference to the Cartesian grid provided in FIG. 5 by X-axis 145 and Y-axis 146).

Although offset vias can be provided in pads or lands in a regular, orthogonal pattern, as shown in FIG. 5, embodiments of the subject matter are not to be construed as limited to such a pattern, and they can be implemented with many other types of patterns that have variations in any of the relevant variables which include but are not limited to land size, via size, relative and actual offset distance, offset angle, and pitch.

Figure 6:
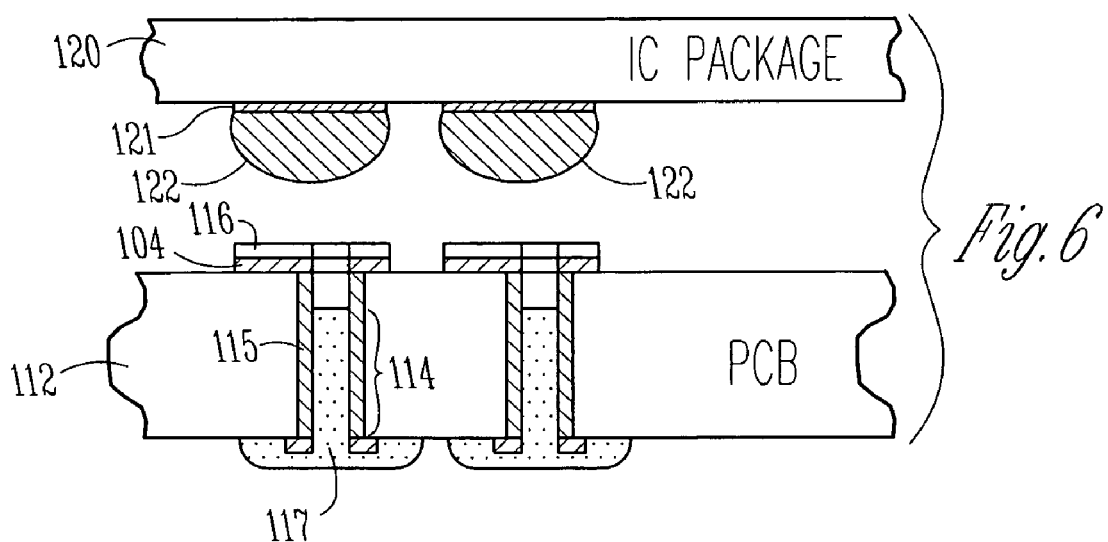
FIG. 6 is a cross-sectional view of the PCB shown in FIG. 4 taken along line 150 of FIG. 4, and in addition a cross-sectional view of an IC package aligned to be coupled to the PCB, in accordance with one embodiment of the subject matter.

FIG. 6 is a cross-sectional view of the PCB 112 shown in FIG. 4 taken along line 150 of FIG. 4, and in addition a cross-sectional view of an IC package 120 aligned to be coupled to the PCB 112, in accordance with one embodiment of the subject matter. PCB 112 and IC package 120 form an electronic assembly that can be part of an electronic system.

As discussed earlier regarding the prior art structure illustrated in FIG. 2, vias 115 are shown containing a thermally expansive substance, such as "via fill" 114, which can include both cured material as well as thermally expansive material such as a volatile organic compound. The particular level of via fill 114 within vias 115 is merely illustrative; the level can range anywhere between full to empty.

In the embodiment shown in FIG. 6, via fill 114 is primarily via capping material from via cap 117. However, via fill 114 can also include processing solvent residues and solder paste. As a result of an operation in which a solder paste material is applied to the upper surface 100 of PCB 112, solder paste 116 resides on lands 104 as well as within vias 115, where it typically constitutes a relatively minor part of via fill 114.

The lower side (as viewed in FIG. 6) of each via 115 has a via cap 117 to prevent via fill 114, such as solder paste, from running out of the via. In one embodiment, via cap 117 can comprise epoxy, but in another embodiment it can comprise a blend of epoxy and acrylate. Via cap 117 can comprise a solder mask material that is partially or entirely cured through thermal and/or ultraviolet treatments. In the embodiment illustrated, via caps 117 not only cover the bottom openings of vias 115, but they also extend upward into vias 115.

IC package 120 comprises a plurality (only two of which are illustrated) of contacts, bumps, or balls 122, each comprising an electrically conductive material such as solder. Solder balls 122 are of approximately the same shape, size, and pitch as lands 104. Solder balls 122 are aligned or "registered" with respect to lands 104.

In a subsequent operation (described with reference to FIG. 7 below), the solder balls 122 and the lands 104, which have been coated with solder paste 116, are heated substantially to the melting point or liquidus of the solder material, so that balls 122 and the solder paste 116 on lands 104 flow together. This causes lands 121 of IC package 120 and lands 104 of PCB 112 to become physically and electrically coupled upon cooling.

Figure 7:
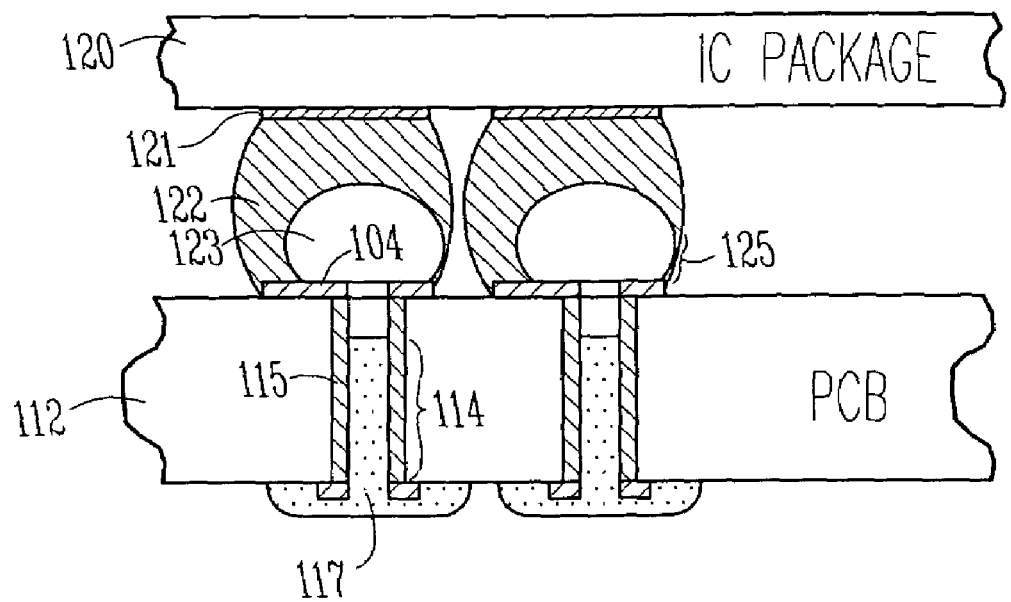
FIG. 7 shows the PCB of the present subject matter being coupled to an IC package during a solder reflow operation in which adjacent solder balls are ballooning but not touching, in accordance with one embodiment of the subject matter.

FIG. 7 shows the PCB 112 of the present subject matter being coupled to an IC package 120 during a solder reflow operation in which adjacent solder balls are ballooning but not touching, in accordance with one embodiment of the subject matter.

When the package structure, comprising IC package 120 and PCB 112, is subjected to heat during a reflow operation, solder balls 122 become molten. In addition, any VOCs in via fill 114 within vias 115 heat up and expand. The VOCs in via fill 114 in the lower portion of via 115 are prevented from exiting downwardly from via 115 by via cap 117.

Due to the presence of unevaporated thermally expansive material within the via fill 114 when the package structure is heated to the solder liquidus, the via fill 114 can outgas in large bubbles 123 within the overlying molten solder balls 122, causing solder balls 122 to expand laterally in a ballooning effect. However, before adjoining solder balls 122 can touch, they vent some or all of the gases that are contained within bubbles 123 through the thinned wall segments 125 of solder ball 122s, causing solder balls 122 to substantially collapse, so that most if not all of the solder in solder balls 122 remains in place between lands 121 of IC package 120 and lands 104 of PCB 112.

The geometry of the via-in-pad structure illustrated in FIG. 7 contributes significantly to the early collapse of solder balls 122. As was discussed earlier regarding the prior art electronic structure illustrated in FIG. 3, solder balls 122 adhere strongly to lands 121 on IC package 120 as well as to lands 104 on PCB 120. As with the prior art example, solder balls 122 have a high surface tension that causes solder balls 122, although molten, to retain a substantially spherical shape.

However, because vias 115 are offset within lands 104, the balloons formed by molten solder balls 122 are asymmetrical. The wall segment 125 of solder ball 122 on the side where via 115 is closest to the edge of land 104 is thinner than the opposite wall of solder ball 122. This permits gasses to be vented more readily from the thinner wall segment 125 of solder ball 122. Thus these wall segments 125 of lands 104 have a strong propensity towards early collapse, before the solder balls 122 grow large enough to touch one another, or to break apart with sufficient force to cause a significant loss of solder material, or to cause shear stress or shock fatigue damage to lands 104.

Figure 8:
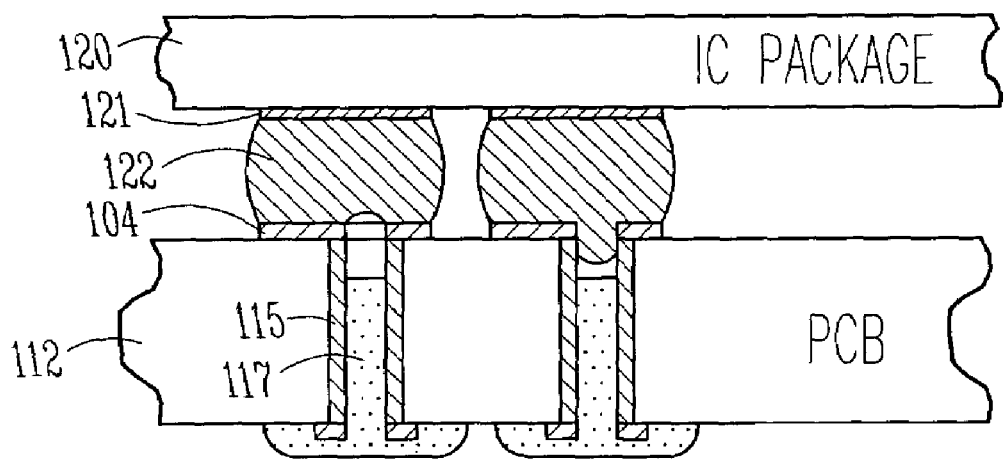
FIG. 8 shows the PCB of the present subject matter coupled to an IC package, in accordance with one embodiment of the subject matter.

FIG. 8 shows the PCB 112 of the present subject matter coupled to an IC package 120, in accordance with one embodiment of the subject matter.

As a direct consequence of vias 115 being offset within respective lands 104, solder balls 122 flow together with the solder paste 116 (FIG. 6) of corresponding lands 104, causing solder balls 122 to form high quality physical and electrical connections to lands 104. Even if outgassing should occur, its effect upon solder balls 122 is inconsequential, because solder balls 122 vent easily and collapse before adjacent solder balls 122 touch each other. The resulting electronic assembly achieves a significantly higher level of integrity and can be produced at a significantly lower cost.

FIG. 9 is a top view of an IC 20 overlying a portion of a substrate 112 having a plurality of lands 151, 161, 171, and 181 each having a respective off-center via 152, 162, 172, and 182, in accordance with one embodiment of the subject matter. In order to avoid the possibility of asymmetric surface tension forces in the molten solder balls (122, FIG. 7) pulling IC 20 away from proper registration with lands, such as lands 104 (FIG. 7), during the solder reflow operation, the lands for any IC are arranged in two groups, so that the surface tension forces are relatively equalized.

A simplified example is illustrated in FIG. 9, wherein one group of lands 151 is arranged on the left-hand side of dashed line 160, and another group of lands 161 is arranged on the right-hand side of dashed line 160. Lands 151 and 161, and vias 152 and 162, are shown in dashed outline, because they are beneath IC 20.

The vias 152 in lands 151 are offset in a direction away from dashed line 160. The vias 162 in lands 161 are offset in the opposite direction.

A similar arrangement holds for other lands 171 and 181 in the bottom portion of substrate 112, in that the vias 172 in lands 171 are offset in a direction away from dashed line 170, and the vias 182 in lands 181 are offset in the opposite direction. The centerline of an IC (not shown) to be mounted to the eight lands comprising four separate lands 171 and four separate lands 181 would be aligned approximately with dashed line 170, in order that asymmetric surface tension forces in its solder balls during a solder reflow operation do not cause the IC to slide to one side.

Figure 10:
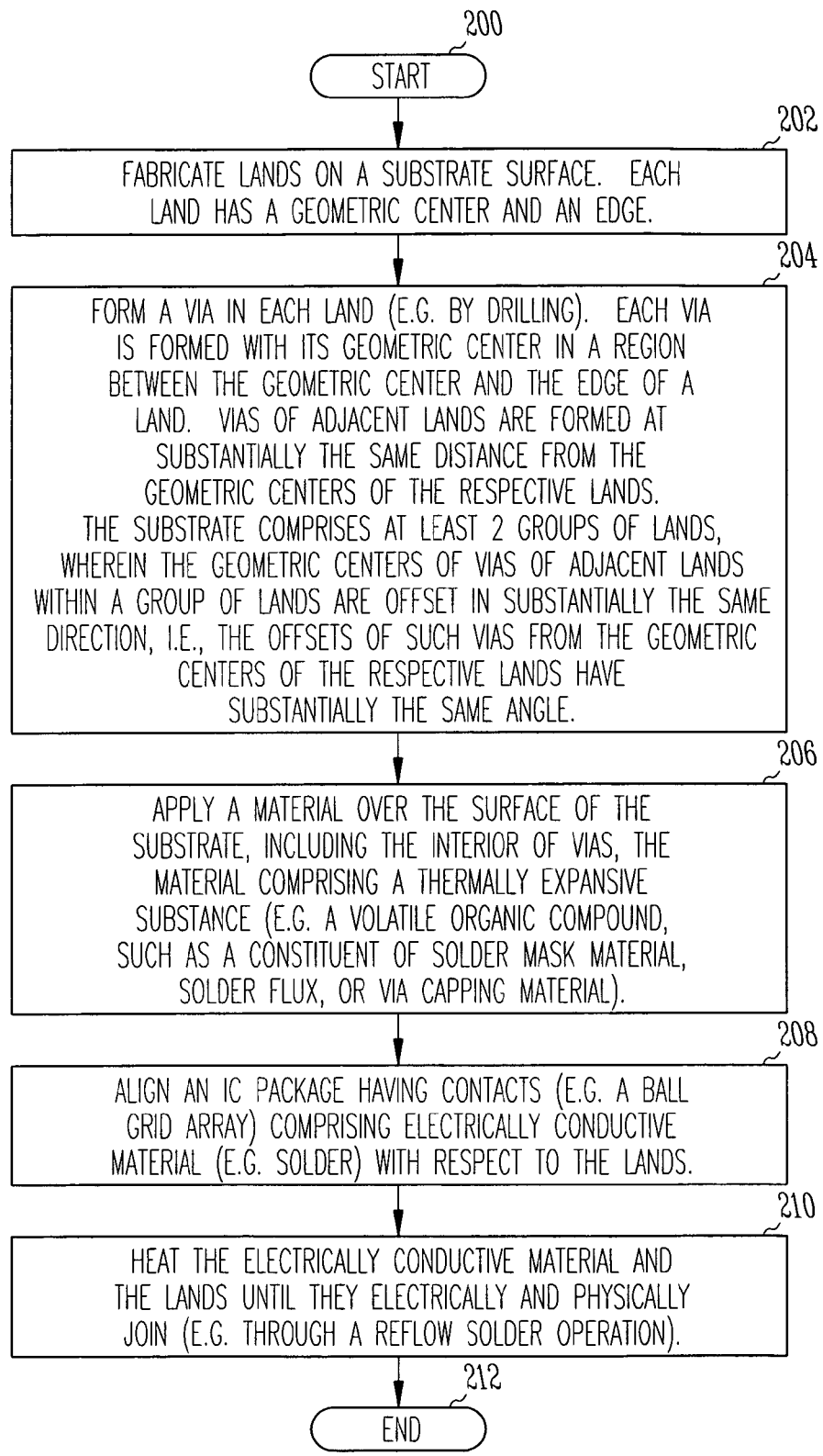
FIG. 10 is a flow diagram of a method of fabricating an electronic assembly that includes forming off-center vias in lands to inhibit adjacent solder balls from bridging, in accordance with one embodiment of the subject matter.

FIG. 10 is a flow diagram of a method of fabricating an electronic assembly that includes forming off-center vias in lands to inhibit adjacent solder balls from bridging, in accordance with one embodiment of the subject matter. The method begins at 200.

In 202, a plurality of lands are fabricated on a surface of a substrate such as a PCB. Each land has a geometric center and an edge, e.g. land 130 has a geometric center 132 and an edge 138 (FIG. 5).

In 204, a via is formed in each land. In one embodiment, the vias are formed by drilling; however, the scope of embodiments of the subject matter is not limited to drilling, and any suitable process for forming vias can be used, such as punching, microperforation, ablation, laser blasting, etching, and so forth. Each via is formed with its geometric center (e.g. geometric center 136 of via 134, FIG. 5) in a region between the geometric center and the edge of a land (e.g. geometric center 132 and edge 138 of land 130, FIG. 5). In one embodiment, no vias are drilled or otherwise formed at the geometric center of a land. However, in other embodiments vias can be formed either off-center or on-center.

Subsequently to the unfinished vias being drilled or otherwise formed in the substrate, the interior walls of the vias are plated or otherwise coated with an electrically conductive material, such as copper.

Vias of adjacent lands (e.g. lands 130, 131, FIG. 5) are formed at substantially the same distance from the geometric centers of their respective lands (e.g. distances 140, 141, FIG. 5).

As was discussed regarding FIG. 9, the substrate comprises at least two groups of lands. The geometric centers of vias of adjacent lands within a group of lands are offset in substantially the same direction; i.e., the offsets of such vias from the geometric centers of the respective lands have substantially the same angle. For example, in FIG. 5, the geometric centers 136 and 137 of vias 130 and 131, respectively, are each offset from the geometric centers (132, 133) of the respective lands (130, 131) by ninety degrees. The grouping of lands having vias offset in the same direction is further illustrated in FIG. 9, wherein a group of lands 151 to the left of dashed line 160 has vias 152 offset towards the left, and another group of lands 161 to the right of dashed line 160 has vias 162 offset towards the right.

In 206, a material is applied over the surface (top and/or bottom) of the substrate, including the interior of some or all of the vias. The material comprises a thermally expansive substance. The thermally expansive substance can be of any type, including a volatile organic compound. The thermally expansive substance can be a constituent of a solder mask or solder resist material, or of a solder flux or solder paste, or of a via capping material, or of a processing solvent, or of any other material that can be applied to the substrate for any purpose prior to a heating operation. The thermally expansive substance can be applied to the upper and/or lower surface of the substrate.

In 208, an IC package having a plurality of contacts (e.g. solder balls in a ball grid array configuration) is aligned with respect to the lands on the substrate surface.

In 210, a heating operation (e.g. a solder reflow operation) is carried out in which the solder contacts and the lands are heated until they electrically and physically join. The method ends at 212.

The operations described above with respect to FIG. 10 can be performed in a different order from those described herein. For example, the lands could be formed after the vias are formed, for example, during the same operation when the interiors of the vias are coated with electrically conductive material.

PCB 112 can be any type of substrate on which electrical components can be mounted, such as a material formed of polyimide, a suitable organic material, silicon, glass, quartz, ceramic, and the like.

The electrical component in the package 120 that is mounted to PCB 112 can be of any type, such as an IC or other semiconductor device; a passive element such as an inductor, capacitor, or resistor; or any other kind of electrical or electronic device. If the electrical component in package 120 is an IC, it can be of any type, such as a microprocessor or microcontroller, memory circuit, application specific integrated circuit (ASIC), digital signal processor (DSP), a radio frequency circuit, an amplifier, a power converter, a filter, a clocking circuit, and the like.

Embodiments of the present subject matter provide significantly improved reliability of the solder connections between the electrical contacts of electronic components, such as surface mount technology components, e.g. ball grid array devices, and corresponding via-in-pad type lands on substrates, e.g., printed circuit boards. By forming the in-pad vias off-center from the geometric center of the lands, the force required for outgassing VOC's to escape ballooning solder balls is significantly lessened due to decreased surface tension and a thinner balloon wall nearer the closer sidewall of the via. This allows ballooning solder balls to vent volatile gasses more rapidly. As a result, the likelihood that adjoining solder balls can come into contact with each other is significantly reduced. Easier venting also enables a greater quantity of solder to remain in the solder joint between the IC package contacts and the substrate lands. This has the overall effect of providing stronger solder connections between the IC package and the substrate, thus ensuring greater reliability of the electronic assembly and of any electronic system incorporating such electronic assembly.

In addition, embodiments of the present subject matter reduce shear stresses and shock fatigue in the vicinity of the via-in-pad, because ballooning solder balls vent easier and with less force, because volatile gasses do not have to overcome as high a surface tension in the surface of the solder ball. Again, this contributes to a more reliable electronic assembly.

As shown herein, embodiments of the subject matter can be implemented in a number of different embodiments, including a method for fabricating a substrate, a method for fabricating an electronic assembly, a substrate, an electronic assembly, and an electronic system. Other embodiments will be readily apparent to those of ordinary skill in the art. The elements, compositions, geometry, architecture, dimensions, and sequence of operations can all be varied to suit particular product and packaging requirements.

The various elements depicted in the drawings are merely representational and are not drawn to scale. Certain proportions thereof may be exaggerated, while others may be minimized. The drawings are intended to illustrate various implementations of the subject matter that can be understood and appropriately carried out by those of ordinary skill in the art.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the subject matter. Therefore, it is manifestly intended that embodiments of the subject matter be limited only by the claims and the equivalents thereof.

What is claimed is:

1. A method comprising:
    forming on a substrate a plurality of mounting lands and a centerline separating the plurality of lands into two substantially equal portions, each land having a circular perimeter and a geometric center, wherein each land has a via offset therein extending into the substrate, wherein each via has a geometric center located in a region between the geometric center and the perimeter of its associated land, wherein the lands comprise a first group having vias whose geometric centers are offset in a first direction with respect to the geometric centers of the corresponding lands of the first group, wherein the lands comprise a second group having vias whose geometric centers are offset in a second direction with respect to the geometric centers of the corresponding lands of the second group, wherein the first and second groups are on opposite sides of the centerline; and wherein the first direction is different from the second direction.

2. The method recited in claim 1, wherein in the forming operation the vias are formed by drilling.

3. The method recited in claim 1, wherein vias of adjacent lands within either the first group or second group are drilled at substantially the same distance from the geometric centers of the respective lands, and wherein the offsets of such vias from the geometric centers of the respective lands have substantially the same angle.

4. The method recited in claim 1, wherein the first direction is opposite to the second direction.

5. The method recited in claim 1, wherein the vias are circular.

6. The method recited in claim 1 and further comprising:
    aligning an integrated circuit package having contacts comprising electrically conductive material with respect to the lands; and
    heating the electrically conductive material and the lands until they join.

7. The method recited in claim 6, wherein the contacts form a portion of a ball grid array.

8. The method recited in claim 6, further comprising:
    prior to aligning, applying a material over the surface of the substrate, including the vias, the material comprising a thermally expansive substance.

9. The method recited in claim 8, wherein the material comprises a volatile organic compound.

10. The method recited in claim 8, wherein the material is from the group comprising a solder mask, a solder flux, a solder paste, a solvent, and a via cap.

11. The method recited in claim 6, wherein the electrically conductive material comprises solder.

12. The method recited in claim 11, wherein in the heating operation the solder adheres to the entire respective land without any other material intervening between the solder and the respective land.

13. The method recited in claim 6, wherein the contacts are solder balls.

* * * * *